(12) United States Patent
Yi et al.

(10) Patent No.: US 12,364,096 B2
(45) Date of Patent: Jul. 15, 2025

(54) LIGHT-EMITTING DEVICE AND OLED DISPLAY PANEL

(71) Applicant: Wuhan China Star Optoelectronics Semiconductor Display Technology Co., Ltd., Hubei (CN)

(72) Inventors: Zhibing Yi, Hubei (CN); Jie Yang, Hubei (CN); Haitao Xu, Hubei (CN); Zhengshen Hua, Hubei (CN); Xiaosu Jiang, Hubei (CN); Yu Zhang, Hubei (CN); Munjae Lee, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/638,866

(22) PCT Filed: Jan. 11, 2022

(86) PCT No.: PCT/CN2022/071282
§ 371 (c)(1),
(2) Date: Feb. 28, 2022

(87) PCT Pub. No.: WO2023/123555
PCT Pub. Date: Jul. 6, 2023

(65) Prior Publication Data
US 2024/0040821 A1    Feb. 1, 2024

(30) Foreign Application Priority Data
Dec. 29, 2021 (CN) .......................... 202111632821.3

(51) Int. Cl.
*H10K 50/818* (2023.01)
*H10K 50/125* (2023.01)

(52) U.S. Cl.
CPC ......... *H10K 50/818* (2023.02); *H10K 50/125* (2023.02)

(58) Field of Classification Search
CPC ............... H10K 50/125; H10K 50/818; H10K 50/00–88; H10K 59/00–95; H10K 2102/00–361
See application file for complete search history.

(56) References Cited

U.S. PATENT DOCUMENTS

| 2014/0183488 A1* | 7/2014 | Setz | ........................ H10K 50/11 257/40 |
| 2015/0155517 A1* | 6/2015 | Lang | .................... H10K 50/157 257/40 |

(Continued)

FOREIGN PATENT DOCUMENTS

| CN | 101006594 | 7/2007 |
| CN | 102723442 | 10/2012 |

(Continued)

OTHER PUBLICATIONS

International Search Report and the Written Opinion Dated Aug. 26, 2022 From the International Searching Authority Re. Application No. PCT/CN2022/071282 and Its Translation Into English. (15 Pages).

(Continued)

*Primary Examiner* — Shahed Ahmed
*Assistant Examiner* — Rhys Poniente Sheker

(57) ABSTRACT

A light-emitting device and an OLED display panel are provided. The light-emitting device includes a charge generation layer. The charge generation layer includes an N-type electron generation layer, a P-type hole generation layer, and a metal activation layer disposed between the two. The metal activation layer is in surface contact with of the N-type electron generation layer and the P-type hole generation layer. It activates a surface energy at contact sur- (Continued)

faces, prevents an accumulation of charges to form an electric field in an internal space, and improves a performance and a lifespan of the light-emitting device.

18 Claims, 3 Drawing Sheets

(56) References Cited

U.S. PATENT DOCUMENTS

| | | | | |
|---|---|---|---|---|
| 2016/0141338 A1* | 5/2016 | Li | ............................ | H10K 50/13 257/40 |
| 2022/0190253 A1* | 6/2022 | Liu | ........................ | H10K 85/626 |
| 2022/0190254 A1* | 6/2022 | Li | .......................... | H10K 50/131 |

FOREIGN PATENT DOCUMENTS

| | | | | |
|---|---|---|---|---|
| CN | 103620809 | | 3/2014 | |
| CN | 103700776 | | 4/2014 | |
| CN | 104051642 | | 9/2014 | |
| CN | 105161633 | | 12/2015 | |
| CN | 111584597 | | 8/2020 | |
| CN | 111864088 A | * | 10/2020 | ......... H01L 27/3244 |
| KR | 10-2015-0048978 | | 5/2015 | |
| WO | WO 2017/024881 | | 2/2017 | |

OTHER PUBLICATIONS

Notification of Office Action and Search Report Dated Feb. 3, 2023 From the State Intellectual Property Office of the People's Republic of China Re. Application No. 202111632821.3 and Its Translation Into English. (25 Pages).

* cited by examiner

LIGHT-EMITTING DEVICE AND OLED DISPLAY PANEL

RELATED APPLICATIONS

This application is a National Phase of PCT Patent Application No. PCT/CN2022/071282 having International filing date of Jan. 11, 2022, which claims the benefit of priority of Chinese Patent Application No. 202111632821.3 filed on Dec. 29, 2021. The contents of the above applications are all incorporated by reference as if fully set forth herein in their entirety.

FIELD AND BACKGROUND OF THE INVENTION

The present disclosure relates to the field of organic light-emitting diode (OLED) display technologies, in particular to a light-emitting device and an OLED display panel.

Organic light-emitting diodes (OLEDs) have advantages of self-luminescence, wide viewing angles, wide color gamut, low power consumption, and faster response speeds, and have become a star flat display product in the 21st century. In comparison with liquid crystal display (LCD) products, OLED products have characteristics of lightness, thinness, flexibility, high contrast, etc., and gradually make their applications in an automotive field, such as a traditional instrumentation, a central control, a rear-view mirror, a rear seat entertainment screen, etc.

At present, automotive OLED displays are pursuing long lifespan and high-efficiency performance. These are also current targets of SAMSUNG, LG, and BOE panel makers. Current reports are to improve the efficiency and lifespan of the device in terms of materials (i.e., phosphorescence, TADF) and structures (i.e., SBS, dual Host, Tandem). However, a combination of materials and structure itself and the pros and cons are still difficult to meet a high standards of vehicles.

SUMMARY OF THE INVENTION

Therefore, existing light-emitting devices have technical problems of short lifespan and poor luminous efficiency.

Embodiments of the present disclosure provide a light-emitting device an OLED display panel, which can solve technical problems of short lifespan and poor luminous efficiency of existing light-emitting devices.

An embodiment of the present disclosure provides a light-emitting device, including:
  a first electrode layer;
  at least two light-emitting structure layers sequentially stacked on the first electrode layer, where each of the light-emitting structure layers includes an electron transport layer, a light-emitting layer, and a hole transport layer, and the light-emitting layer is disposed between the adjacent electron transport layer and the hole transport layer;
  a second electrode layer disposed on the light-emitting structure layers; and
  a charge generation layer disposed between the light-emitting structure layers.

The charge generation layer includes an N-type electron generation layer, a metal activation layer, and a P-type hole generation layer, the metal activation layer is disposed between the N-type electron generation layer and the P-type hole generation layer, and one surface and another surface of the metal activation layer are in surface contact with the N-type electron generation layer and the P-type hole generation layer, respectively.

Alternatively, in some embodiment of the present disclosure, the first electrode layer is an anode, the second electrode layer is a cathode, two of the light-emitting structure layers are disposed between the anode and the cathode, the light-emitting structure layers include a first light-emitting structure layer and a second light-emitting structure layer, the first light-emitting structure layer is disposed on the anode, the charge generation layer is disposed on the first light-emitting structure layer, and the second light-emitting structure layer is disposed on the charge generation layer.

Alternatively, in some embodiment of the present disclosure, the first light-emitting structure layer includes a first hole transport layer, a first light-emitting layer, and a first electron transport layer that are stacked, the second light-emitting structure layer includes a second hole transport layer, a second light-emitting layer, and a second electron transport layer that are stacked, the N-type electron generation layer is disposed on the first electron transport layer, the metal activation layer is disposed on the N-type electron generation layer, the P-type hole generation layer is disposed on the metal activation layer, and the second hole transport layer is disposed on the P-type hole generation layer.

Alternatively, in some embodiment of the present disclosure, the anode includes a transparent metal layer and a reflective layer, and the metal activation layer is a semi-reflective and semi-transparent film layer.

Alternatively, in some embodiment of the present disclosure, the metal activation layer includes at least one of silver, lithium, ytterbium, magnesium, gold, barium, calcium, aluminum, indium, LiF, indium tin oxide, indium zinc oxide, and AZO.

Alternatively, in some embodiment of the present disclosure, a thickness of the metal activation layer is less than a thickness of the reflective layer.

Alternatively, in some embodiment of the present disclosure, a thickness of the metal activation layer ranges from 3 Å to 100 Å.

Alternatively, in some embodiment of the present disclosure, there is a first optical path length between the anode and the first light-emitting layer, there is a second optical path length between the anode and the metal activation layer, there is a third optical path length between the anode and the second light-emitting layer, the first optical path length is $\delta A$, the second optical path length is $\delta B$, the third optical path length is $\delta C$, a range of the first optical path length $\delta A$ is $(1/4)m_1\lambda \pm 50$ Å, a range of the second optical path length $\delta B$ is $(2/4)m_2\lambda \pm 50$ Å, a range of the third optical path length $\delta C$ is $(3/4)m_3\lambda \pm 50$ Å, $m_1$, $m_2$, and $m_3$ are all positive integers, and $\lambda$ is a light emission wavelength of the light-emitting layer.

Alternatively, in some embodiment of the present disclosure, a thickness of each functional film layer in the third optical path length and its refractive index satisfy a following relationship: $n_1d_1+n_2d_2+ \ldots +n_id_i(3/4)m_3\lambda \pm 50$ Å, $d_i$ is a thickness of a functional film layer of an i-th layer, $n_i$ is a refractive index of the functional film layer of the i-th layer, $m_3$ is a positive integer, and $\lambda$ is the light emission wavelength of the light-emitting layer.

Alternatively, in some embodiment of the present disclosure, a range of the first optical path length $\delta A$ is $(1/4)\lambda \pm 50$ Å, a range of the second optical path length $\delta B$ is $(2/4)\lambda \pm 50$ Å, and a range of the second optical path length $\delta C$ is $(3/4)\lambda \pm 50$ Å.

Alternatively, in some embodiment of the present disclosure, a distance from the first light-emitting layer to the reflective layer, a distance from the first light-emitting layer to the metal activation layer, and a distance from the metal activation layer to the second light-emitting layer are equal.

Alternatively, in some embodiment of the present disclosure, a ratio of a distance from the first light-emitting layer to the anode to a distance from the first light-emitting layer to the cathode ranges from 1:3 to 1:4; a ratio of a distance from the metal activation layer to the anode to a distance from the metal activation layer to the cathode ranges from 1:1 to 1:1.5; and a ratio of a distance from the second light-emitting layer to the anode to a distance from the second light-emitting layer to the cathode ranges from 3:1 to 3:2.

Alternatively, in some embodiment of the present disclosure, the first light-emitting layer includes a first red light-emitting portion, a first blue light-emitting portion, and a first green light-emitting portion, the second light-emitting layer includes a second red light-emitting portion, a second blue light-emitting portion, and a second green light-emitting portion, the first red light-emitting portion and the second red light-emitting portion are aligned, the first blue light-emitting portion and the second blue light-emitting portion are aligned, and the first green light-emitting portion and the second green light-emitting portion are aligned.

Alternatively, in some embodiment of the present disclosure, the first light-emitting layer and the second light-emitting layer are monochromatic light-emitting layers of a same color.

Alternatively, in some embodiment of the present disclosure, the light-emitting device further includes a compensation layer, the compensation layer includes a first compensation layer and a second compensation layer, the first compensation layer is disposed on a surface of the first light-emitting layer close to the anode, the second compensation layer is disposed on a surface of the second light-emitting layer close to the anode, and the compensation layer is configured to adjust the first optical path length, the second optical path length, and the third optical path length.

Alternatively, in some embodiment of the present disclosure, the first compensation layer includes a first red compensation portion corresponding to the first red light-emitting portion, a first blue compensation portion corresponding to the first blue light-emitting portion, and a first green compensation portion corresponding to the first green light-emitting portion, and the first red compensation portion, the first green compensation portion, and the first blue compensation portion have different heights.

Alternatively, in some embodiment of the present disclosure, a height of the first red compensation portion is greater than a height of the first green compensation portion than a height of the first blue compensation portion.

Alternatively, in some embodiment of the present disclosure, the second compensation layer includes a second red compensation portion corresponding to the second red light-emitting portion, a second blue compensation portion corresponding to the second blue light-emitting portion, and a second green compensation portion corresponding to the second green light-emitting portion, and the second red compensation portion, the second green compensation portion, and the second blue compensation portion have different heights.

Alternatively, in some embodiment of the present disclosure, a height of the second red compensation portion is greater than a height of the second green compensation portion than a height of the second blue compensation portion.

An embodiment of the present application provides an OLED display panel, and the OLED display panel includes the light-emitting device described in any of the foregoing embodiments.

The present disclosure provides the light-emitting device. The metal activation layer is disposed between the N-type electron generation layer and the P-type hole generation layer, and the metal activation layer is in surface contact with of both. The metal activation layer can activate a surface energy at contact surfaces to maximize a transportation of holes and electrons to the light-emitting layer. An electric charge accumulation is prevented from forming an electric field in an internal space, a working voltage is reduced, and a performance and a lifespan of the light-emitting device are improved.

BRIEF DESCRIPTION OF THE SEVERAL VIEWS OF THE DRAWINGS

In order to more clearly illustrate technical solutions in the embodiments of the present disclosure, the following will briefly introduce drawings that need to be used in the description of the embodiments. Obviously, the drawings in the following description are only some embodiments of the present disclosure. For those skilled in the art, other drawings can be obtained based on these drawings without creative efforts.

Figure 1:
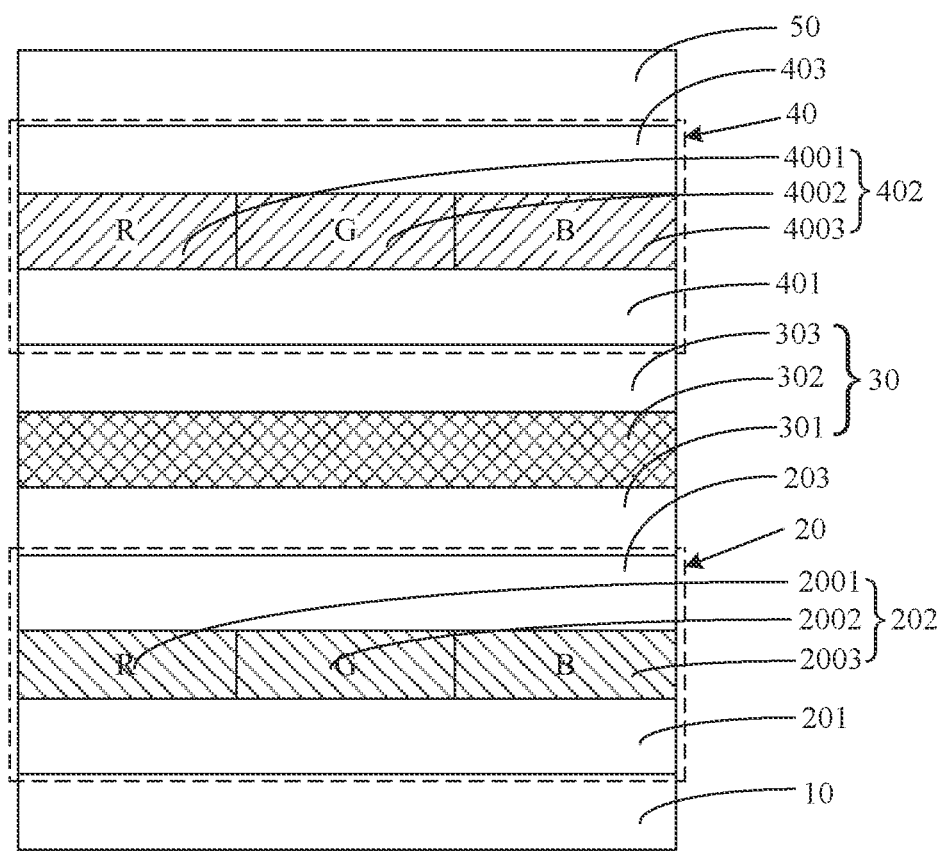
FIG. 1 is a cross-sectional view of a first type of light-emitting device of an embodiment of the present disclosure.

Reference numerals are as follows:

| Reference numeral | Component | Reference numeral | Component |
|---|---|---|---|
| 10 | first electrode layer | 20 | first light-emitting structure layer |
| 30 | charge generation layer | 40 | second light-emitting structure layer |
| 50 | second electrode layer | 201 | first hole transport layer |
| 202 | first light-emitting layer | 203 | first electron transport layer |
| 2001 | first red light-emitting portion | 2002 | first green light-emitting portion |
| 2003 | first blue light-emitting portion | 301 | N-type electron generation layer |
| 302 | metal activation layer | 303 | P-type hole generation layer |
| 401 | second hole transport layer | 402 | second light-emitting layer |
| 403 | second electron transport layer | 4001 | second red light-emitting portion |
| 4002 | second green light-emitting portion | 4003 | second blue light-emitting portion |
| 60 | first compensation layer | 70 | second compensation layer |

-continued

| Reference numeral | Component | Reference numeral | Component |
|---|---|---|---|
| 601 | first red compensation portion | 602 | first green compensation portion |
| 603 | first blue compensation portion | 701 | second red compensation portion |
| 702 | second green compensation portion | 703 | second blue compensation portion |

DESCRIPTION OF SPECIFIC EMBODIMENTS OF THE INVENTION

The technical solutions in the embodiments of the present disclosure will be clearly and completely described below in conjunction with the drawings in the embodiments of the present disclosure. Obviously, the described embodiments are only a part of the embodiments of the present disclosure, rather than all the embodiments. Based on the embodiments in the present disclosure, all other embodiments obtained by those skilled in the art without creative efforts shall fall within the scope of protection of the present disclosure. Furthermore, it should be understood that the specific implementations described herein are only used to illustrate and explain the present disclosure, and are not used to limit the present disclosure. In the present disclosure, if no explanation is made to the contrary, orientation terms such as "upper" and "lower" usually refer to upper and lower positions of a device in actual use or working conditions, specifically the direction of the drawing in the drawings; while "inner" and "outer" refer to an outline of the device.

Figure 2:
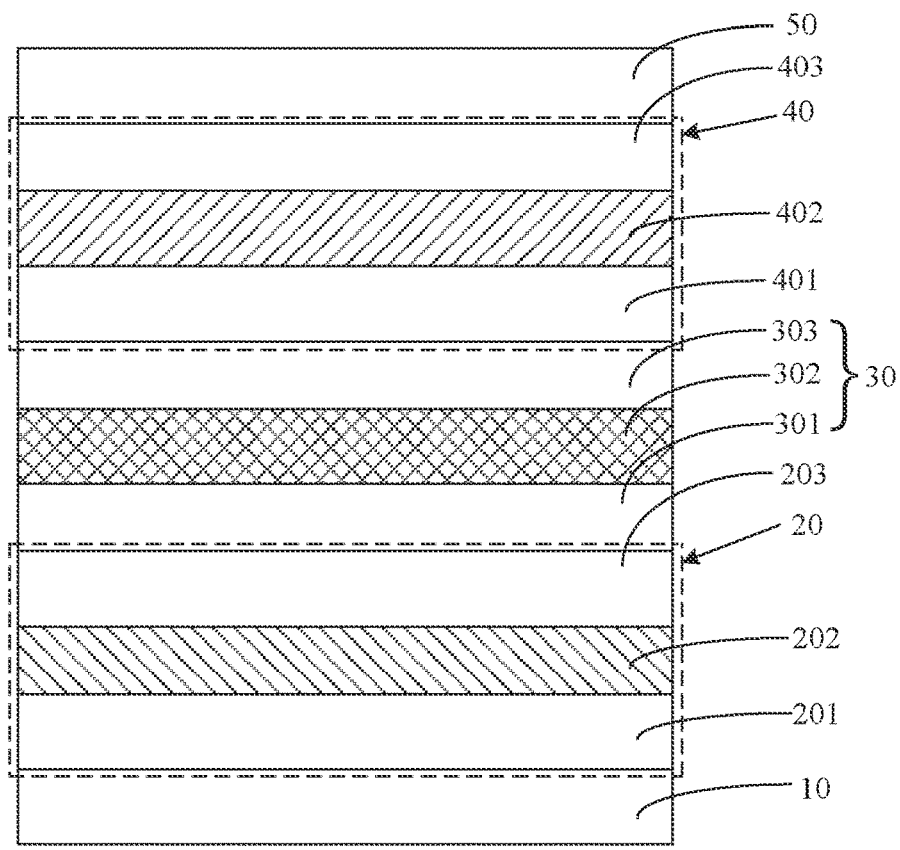
FIG. 2 is a cross-sectional view of a second type of light-emitting device of an embodiment of the present disclosure.

Refer to FIG. 1, FIG. 2, the present disclosure provides a light-emitting device. The light-emitting device includes a first electrode layer 10, at least two light-emitting structure layers, a second electrode layer 50, and a charge generation layer 30. The light-emitting structure layers are stacked on the first electrode layer 10. The light-emitting structure layer includes an electron transport layer, a light-emitting layer, and a hole transport layer. The light-emitting layer is disposed between the adjacent electron transport layer and the hole transport layer. The second electrode layer 50 is disposed on the light-emitting structure layer. The charge generation layer 30 is disposed between two adjacent light-emitting structure layers. The charge generation layer 30 includes an N-type electron generation layer 301, a metal activation layer 302, and a P-type hole generation layer 303. The metal activation layer 302 is disposed between the N-type electron generation layer 301 and the P-type hole generation layer 303. One surface and another surface of the metal activation layer 302 are in surface contact with the N-type electron generation layer 301 and the P-type hole generation layer 303 respectively.

In this embodiment, the metal activation layer 302 is disposed between the N-type electron generation layer 301 and the P-type hole generation layer 303. The metal activation layer 302 is in surface contact with both. The metal activation layer 302 can activate a surface energy at contact surfaces to increase a transport rate of holes and electrons. An electric charge accumulation is prevented from forming an electric field in an internal space, a working voltage is reduced, and a performance and a lifespan of the light-emitting device are improved.

The metal activation layer 302 is stacked on the N-type electron generation layer 301, and the P-type hole generation layer 303 is stacked on the metal activation layer 302.

Charges generated by the charge generation layer 30 are divided into electrons and holes that travel in opposite directions. The electrons are transferred from the N-type electron generation layer 301 to the first electron transport layer 203. The holes are transferred from the P-type hole generation layer 303 to the second hole transport layer 401.

The metal activation layer 302 can activate the surface energy of the P-type hole generation layer 303 and the N-type electron generation layer 301, and prevent the accumulation of charges on an interface of an organic layer to form an electric field in an internal space. Thus, the holes and the electrons are maximally transmitted to the two light-emitting layers. It reduces a working voltage, and improves the performance and lifespan of the device.

A layer interface of the organic layer includes a layer interface of the P-type hole generation layer and a layer interface of the N-type electron generation layer. The layer interface of the P-type hole generation layer is an interface between the P-type hole generation layer and the metal activation layer. The layer interface of the N-type electron generation layer is an interface between the N-type electron generation layer and the metal activation layer.

The technical solutions of the present disclosure will now be described in conjunction with specific embodiments.

Referring to FIG. 1 and FIG. 2, in one embodiment, the first electrode layer 10 is an anode, and the second electrode layer 50 is a cathode. Two of the light-emitting structure layers are disposed between the anode and the cathode. The light-emitting structure layers include a first light-emitting structure layer 20 and a second light-emitting structure layer 40. The first light-emitting structure layer 20 is disposed on the anode. The charge generation layer 30 is disposed on the first light-emitting structure layer 20. The second light-emitting structure layer 40 is disposed on the charge generation layer 30.

In one embodiment, the first light-emitting structure layer 20 includes a first hole transport layer 201, a first light-emitting layer 202, and a first electron transport layer 203 that are stacked. The second light-emitting structure layer 40 includes a second hole transport layer 401, a second light-emitting layer 402, and a second electron transport layer 403 that are stacked. The N-type electron generation layer 301 is disposed on the first electron transport layer 203. The metal activation layer 302 is disposed on the N-type electron generation layer 301. The P-type hole generation layer 303 is disposed on the metal activation layer 302. The second hole transport layer 401 is disposed on the P-type hole generation layer 303.

In one embodiment, the metal activation layer 302 is a semi-reflective and semi-transparent film layer. The anode includes a transparent metal layer and a reflective layer that are stacked.

A thickness of the metal activation layer ranges from 3 Å to 100 Å. Preferably, the thickness of the metal activation layer is greater than or equal to 5 Å and less than or equal to 50 Å.

A thickness of the metal activation layer 302 is less than that of the reflective layer. Therefore, through the thickness, the reflective layer is a fully reflective film layer, and the metal activation layer 302 is the semi-reflective and semi-transparent film layer.

The metal activation layer 302 is disposed between the anode and the cathode, and the metal activation layer 302 is the semi-reflective and semi-transparent film layer. Thus, there are a plurality of microcavities formed between the anode and the cathode. A micro cavity is formed between the anode and the metal activation layer. Another microcavity is formed between the anode and the cathode. Another microcavity is formed between the metal activation layer and the cathode.

In this embodiment, the semi-reflective and semi-transparent film layer is disposed between the P-type hole generation layer 303 and the N-type electron generation layer 301. Thus, the plurality of microcavities are formed to realize an enhancement of light of the same wavelength, which is beneficial to light extraction and improves light extraction efficiency.

Referring to FIG. 2, in an embodiment, the first light-emitting layer 202 and the second light-emitting layer 402 are monochromatic light-emitting layers of the same color.

The first light-emitting layer 202 and the second light-emitting layer 402 may be the same red light-emitting layer/blue light-emitting layer/green light-emitting layer/white light-emitting layer.

Figure 3:
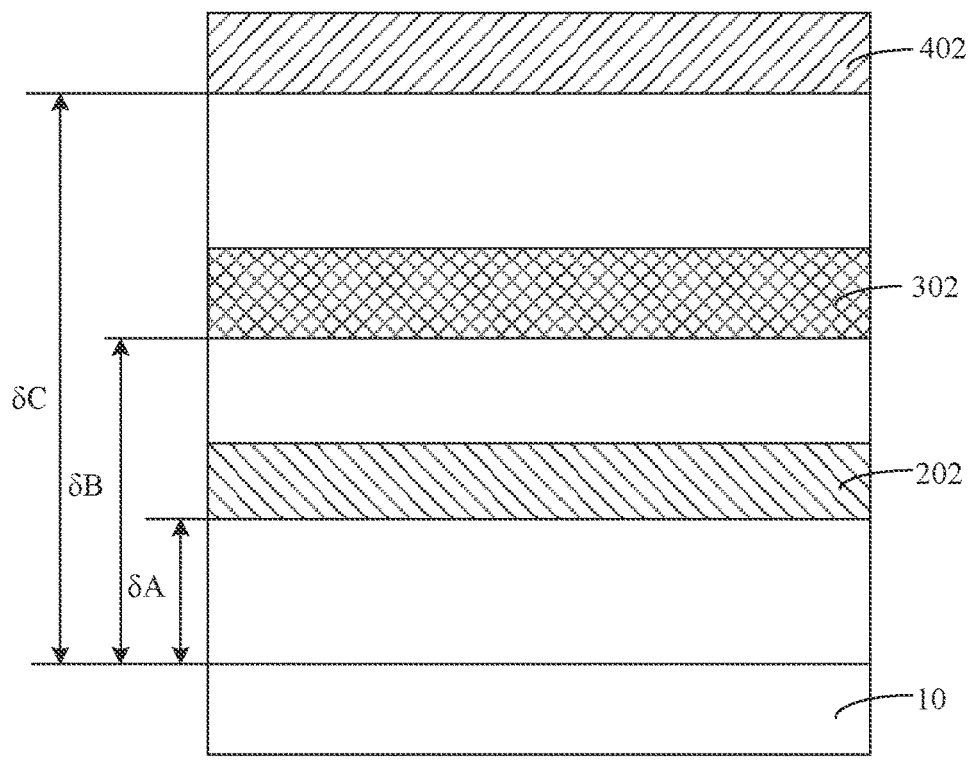
FIG. 3 is a cross-sectional view of a third type of the light-emitting device of the present disclosure embodiment.

Referring to FIG. 3, in one embodiment, there is a first optical path length between the anode and the first light-emitting layer 202. There is a second optical path length between the anode and the metal activation layer 302. There is a third optical path length between the anode and the second light-emitting layer 402. The first optical path length is δA. The second optical path length is δB. The third optical path length is δC.

In one embodiment, the first optical path length, the second optical path length, and the third optical path length may have the same value for the same color sub-pixels.

In one embodiment, the first optical path length satisfies $\delta A = (1/4)m_1\lambda \pm 50$ Å, a range of the second optical path length $\delta B$ is $(2/4)m_2\lambda \pm 50$ Å, a range of the third optical path length $\delta C$ is $(3/4)m_3\lambda \pm 50$ Å, $m_1$, $m_2$, and $m_3$ are all positive integers, $\lambda$ is a light emission wavelength of the light-emitting layer. Any of the ±50 Å mentioned in the present disclosure is an error range in consideration of process accuracy, and will not be repeated in the following text.

Preferably, the $m_1$, $m_2$, and $m_3$ are all positive integers less than or equal to 8.

The first optical path length has the same value for sub-pixels of the same color.

In the first optical path length, a thickness d of each functional film layer and its refractive index n satisfy the following relationship: $n_1d_1+n_2d_2+ \ldots +n_id_i(1/4)m_1\lambda \pm 50$ Å, di is a thickness of an i-th layer of the functional film layers, $n_i$ is a refractive index of the i-th layer of the functional film layers, and $m_1$ is a positive integer.

The second optical path length has the same value for sub-pixels of the same color.

In the second optical path length, a thickness of each functional film layer and its refractive index satisfy the following relationship: $n_1d_1+n_2d_2+ \ldots +n_id_i(2/4)m_2\lambda \pm 50$ Å, di is a thickness of an i-th layer of the functional film layers, $n_i$ is a refractive index of the an i-th layer of the functional film layers, and $m_2$ is a positive integer.

The third optical path length has the same value for sub-pixels of the same color.

In the third optical path length, a thickness of each functional film layer and its refractive index satisfy the following relationship: $n_1d_1+n_2d_2+ \ldots +n_id_i(3/4)m_3\lambda \pm 50$ Å, di is a thickness of an i-th layer of the functional film layers, $n_i$ is a refractive index of the an i-th layer of the functional film layers, and $m_3$ is a positive integer.

It can be understood that by limiting the first optical path length, the second optical path length, and the third optical path length, lights of the same wavelength of two adjacent light-emitting layers interfere with each other to achieve an enhanced effect and improve light efficiency.

In one embodiment, a distance from the first light-emitting layer to the reflective layer, a distance from the first light-emitting layer to the metal activation layer, and a distance from the metal activation layer to the second light-emitting layer are equal.

Preferably, $m_1:m_2:m_3=1:1:1$.

A range of the first optical path length δA is $(1/4)\lambda \pm 50$ Å. A range of the second optical path length δB is $(2/4)\lambda \pm 50$ Å. A range of the second optical path length δC is $(3/4)\lambda \pm 50$ Å.

Specifically, $m_1$ is 1, $m_2$ is 1, and $m_3$ is 1. At this time, the first optical path length, the second optical path length, and the third optical path length all take the smallest value within their range. The thickness of the light-emitting device is the smallest, thereby realizing a thin and light display.

In one embodiment, a ratio of a distance from the first light-emitting layer to the anode to a distance from the first light-emitting layer to the cathode ranges from 1:3 to 1:4. A ratio of a distance from the metal activation layer to the anode and a distance from the metal activation layer to the cathode ranges from 1:1 to 1:1.5. A ratio of a distance from the second light-emitting layer to the anode and a distance from the second light-emitting layer to the cathode ranges from 3:1 to 3:2.

Specifically, $m_1:m_2:m_3=1:1:1$ is taken as an example for description, but it is not limited to $m_1:m_2:m_3=1:1:1$, and $m_1$, $m_2$, and $m_3$ can be any positive integers.

When $m_1:m_2:m_3=1:1:1$, the range of the first optical path length δA is $(1/4)\lambda \pm 50$ Å, the range of the second optical path length δB is $(2/4)\lambda \pm 50$ Å, and the range of the second optical path length δC is $(3/4)\lambda \pm 50$ Å.

It can be understood that when the ratio of the distance from the first light-emitting layer to the anode to the distance from the first light-emitting layer to the cathode is 1:3, the distance from the second light-emitting layer to the cathode is $(1/4)\lambda \pm 50$ Å. When the ratio of the distance from the first light-emitting layer to the anode to the distance from the first light-emitting layer to the cathode is 1:4, the distance from the second light-emitting layer to the cathode is $(2/4)\lambda \pm 50$ Å. Therefore, when the ratio of the distance between the first light-emitting layer to the anode and the distance from the first light-emitting layer to the cathode is in the range of 1:3 to 1:4, a range of the distance from the second light-emitting layer to the cathode is $(1/4)\lambda \pm 50$ Å to $(2/4)\lambda \pm 50$ Å.

It is understandable that when the ratio of the distance from the metal activation layer to the anode and the distance from the metal activation layer to the cathode is 1:1, the distance from the second light-emitting layer to the cathode is $(1/4)\lambda \pm 50$ Å. When the ratio of the distance from the metal activation layer to the anode to the distance from the metal activation layer to the cathode is 1:1.5, the distance from the second light-emitting layer to the cathode is $(2/4)\lambda \pm 50$ Å. Therefore, the range of the distance from the second light-emitting layer to the cathode is $(1/4)\lambda \pm 50$ Å to $(2/4)\lambda \pm 50$ Å.

It is understandable that when the ratio of the distance from the second light-emitting layer to the anode to the distance from the second light-emitting layer to the cathode is 3:1, the distance from the second light-emitting layer to the cathode is $(1/4)\lambda \pm 50$ Å. When the ratio of the distance from the second light-emitting layer to the anode to the distance from the second light-emitting layer to the cathode is 3:2, the distance from the second light-emitting layer to the cathode is $(2/4)\lambda \pm 50$ Å. Therefore, the range of the distance from the second light-emitting layer to the cathode is $(1/4)\lambda \pm 50$ Å to $(1/4)\lambda \pm 50$ Å.

It should be noted that when $m_1:m_2:m_3=1:1:1$, the range of the distance from the second light-emitting layer to the cathode is $(1/4)\lambda \pm 50$ Å to $(3/4)\lambda \pm 50$ Å.

In this embodiment, by further limiting the ranges of the distance ratios between the first light-emitting layer, the metal activation layer, and the second light-emitting layer in the microcavities to the anode and the cathode at both ends of the microcavities, the lights in the microcavities further meet a multi-beam interference enhancement, which improves the light-emitting efficiency and lifespan of the light-emitting device.

In one embodiment, for the first optical path length, a position of a light-emitting surface of the first light-emitting layer can be selected in multiple ways.

The light-emitting surface may be located on a side of the first light-emitting layer facing the anode or on a side away from the anode.

Preferably, a position of the first optical path length can be selected to be 50-150 Å on the side of the first light-emitting layer facing the anode.

In one embodiment, for the third optical path length, a position of a light-emitting surface of the second light-emitting layer can be selected in multiple ways.

The light-emitting surface may be located on a side of the second light-emitting layer facing the anode or on a side far away from the anode.

Preferably, a position of the third optical path length can be selected to be 50-150 Å on the side of the second light-emitting layer facing the anode.

Referring to FIG. 2, in one embodiment, the first light-emitting layer 202 is a yellow light-emitting layer, the second light-emitting layer 402 is a blue light-emitting layer, and the light-emitting device emits white light.

The yellow light emitted by the yellow light-emitting layer includes red light and green light. The red light and the green light are mixed with the blue light of the second light-emitting layer 402 to form white light to emit.

In this embodiment, by limiting the first light-emitting layer 202 and the second light-emitting layer 402, the light-emitting device may be a white light-emitting device.

It is understandable that the first light-emitting layer 202 may also be purple light. The purple light is formed by mixing red light and blue light. The second light-emitting layer 402 may also be cyan light. The cyan light is formed by mixing blue light and green light. However, the present invention is not limited to this, as long as it is satisfied that a mixed light of the first light-emitting layer 202 and the second light-emitting layer 402 includes three primary colors of red, green, and blue.

It should be noted that the first light-emitting layer 202 or the second light-emitting layer 402 may have a stacked structure. For example, the first light-emitting layer 202 includes a red light-emitting layer and a blue light-emitting layer that are stacked. The second light-emitting layer 402 is a green light-emitting layer. In the same way, the second light-emitting layer 402 may also have the above-mentioned stacked structure, but the present invention is not limited to this.

In an embodiment, the light-emitting device further includes an electron injection layer and a hole injection layer. The electron injection layer is disposed on a surface of the cathode facing the anode. The hole injection layer is disposed on a surface of the anode facing the cathode.

The light-emitting device includes an electron injection layer, a hole injection layer, an electron transport layer, and a hole transport layer. The hole transport layer includes the first hole transport layer 201 and the second hole transport layer 401. The electron transport layer includes the first electron transport layer 203 and the second electron transport layer 403. The electron injection layer is used to stably inject electrons into the second electron transport layer 403. The hole injection layer is used to stably inject holes into the first hole transport layer 201. The first hole transport layer 201 is used to stably transport holes to the first light-emitting layer 202. The second hole transport layer 401 is used to stably transport holes to the second light-emitting layer 402. The first electron transport layer 203 is used to stably transport electrons to the first light-emitting layer 202. The second electron transport layer 403 is used to stably transport electrons to the second light-emitting layer 402.

The first hole transport layer 201 and the second hole transport layer 401 may be selected from a group consisting of N'-diphenylbenzidine (NPD), N,N'-bis-(3-methylphenyl)-N,N'-bis-(phenyl)-benzidine (TPD), s-TAD, and 4,4',4"-tris(N-3-methylphenyl-N-phenylamino)triphenylamine (MTDATA), but the present disclosure is not limited thereto.

The first electron transport layer 203 and the second electron transport layer 403 may be selected from a group consisting of PDB, TAZ, Spiro-PBD, BAlq, and SAlq, but the present disclosure is not limited thereto.

The hole injection layer may be selected from a group consisting of poly(3,4-ethylenedioxythiophene) (PEDOT), polyaniline (PANI), and N,N'-dinaphthyl-N,N'-diphenylbenzidine (NPD), but the present disclosure is not limited thereto.

The electron injection layer may be selected from a group consisting of PBD, TAZ, spiro-PBD, BAlq, and SAlq, but the present disclosure is not limited to the above. In addition, the electron injection layer may be formed of a metal halide, for example, selected from a group consisting of MgF2, LiF, NaF, KF, RbF, CsF, FrF, and CaF2, but the present disclosure is not limited to the above.

In one embodiment, the N-type electron generation layer 301 is an organic film layer doped with metal, and the P-type hole generation layer 303 is an organic film layer doped with metal or P-type dopants.

The N-type electron generation layer 301 and the P-type hole generation layer 303 are connected to each other through the metal activation layer 302. The N-type electron generation layer 301 generates electric charges or divides the electric charges into holes and electrons to inject electrons into the first light-emitting layer 202. That is, the N-type electron generation layer 301 supplies electrons to the first light-emitting layer 202 adjacent to the anode. The P-type hole generation layer 303 supplies holes to the second light-emitting layer 402 adjacent to the cathode.

The N-type electron generation layer 301 may be composed of organic materials with metal dopants.

Further, the metal dopant may be one or a combination of at least two of Ag, Mg, Yb, Li, Al, Au, Ca, and Ba.

The P-type hole generation layer 303 may be formed of an organic material doped with a metal or a P-type dopant.

The P-type dopant may be a derivative of tetracyanoquinodimethane, iodine, FeCL3, FeF3, and SbCl5. The substrate can be at least one of N,N'-diphenyl-N,N'-bis(3-methyl-phenyl)-[1,1'-biphenyl]-4,4'-diamine (TPD), and N,N,N',N'-tetranaphthalen-2-ylbenzidine (TNB).

The metal activation layer can be one or a combination of high work function silver, lithium, ytterbium, magnesium, gold, barium, calcium, aluminum, indium, LiF, indium tin oxide, indium zinc oxide, and AZO.

In this embodiment, the metal activation layer 302 is disposed between the adjacent N-type electron generation layer 301 and the P-type hole generation layer 303, and the two are connected to each other through the metal activation layer 302.

It is worth noting that the high work function metal activation layer 302 suppresses the charge accumulation of the charge generation layer 30 and prevents the decline of electron injection in the N-type electron generation layer 301, thereby significantly reducing the working voltage and improving the luminous efficiency.

It is worth noting that the amount of charges of the metal activation layer 302 is geometrically increased compared to the N-type electron generation layer 301 and the P-type hole generation layer 303, which can activate a surface energy of the N-type electron generation layer 301 and the P-type hole generation layer 303. It prevents the generation of an electric field in a space, maximizes the transportation of holes and electrons to the two light-emitting layers, and achieves the effect of improving the lifespan of the device.

Alternatively, in an embodiment, the metal activation layer 302 can be formed by using existing formation materials of film layers, which can reduce a manufacturing cost. Preferably, the material and process of the cathode layer are used.

In an embodiment, each film layer in the light-emitting structure layer and the N-type electron generation layer 301 and the P-type hole generation layer 303 are all organic film layers.

The organic film layers in the third optical path length sequentially includes the first hole transport layer 201, the first light-emitting layer 202, the first electron transport layer 203, the N-type electron generation layer 301, the P-type hole generation layer 303, the second hole transport layer 401, and the second light-emitting layer 402.

It is understandable that, taking the third optical path length as an example, for a light-emitting device with two light-emitting structure layers arranged between the anode and the cathode, a reactive index of the first hole transport layer 201 is $n_1$, and a thickness of the first hole transport layer 201 is $d_1$. A reactive index of the first light-emitting layer 202 is $n_2$, and a thickness of the first light-emitting layer 202 is $d_2$. A reactive index of the first electron transport layer 203 is $n_3$, and a thickness of the first electron transport layer 203 is $d_3$. The reactive index of the N-type electron generation layer 301 is $n_4$, and a thickness of the N-type electron generation layer 301 is $d_4$. A reactive index of the P-type hole generation layer 303 is $n_5$, and a thickness of the P-type hole generation layer 303 is $d_5$. A reactive index of the second hole transport layer 401 is $n_6$, and a thickness of the second hole transport layer 401 is $d_6$.

It should be noted that the thickness of the organic film layer in the third optical path length satisfies $n_1d_1+n_2d_2+n_3d_3+n_4d_4+n_5d_5+n_6d_6=(3/4)m_3\lambda\pm50$ Å. The range of the third optical path length satisfies $(3/4)\lambda\pm50$ Å, and $m_3$ is an integer greater than 1. The ±50 Å in the $(3/4)\lambda\pm50$ Å is a possible process error.

Furthermore, the light-emitting surfaces of the first light-emitting layer 202 and the second light-emitting layer 402 are both located in a range of 50 Å to 100 Å in thickness at a bottom surface of the light-emitting layer.

In one embodiment, the first light-emitting layer 202 includes a first red light-emitting portion 2001, a first green light-emitting portion 2002, and a first blue light-emitting portion 2003. The second light-emitting layer 402 includes a second red light-emitting portion 4001, a second green light-emitting portion 4002, and a second blue light-emitting portion 4003. The first red light-emitting portion 2001 and the second red light-emitting portion 4001 are aligned. The first green light-emitting portion 2002 and the second green light-emitting portion 4002 are aligned. The first blue light-emitting portion 2003 and the second blue light-emitting portion 4003 are arranged.

An orthographic projection of the first red light-emitting portion 2001 on the first electrode layer 10 overlaps with an orthographic projection of the second red light-emitting portion 4001 on the first electrode layer 10. An orthographic projection of the first green light-emitting portion 2002 on the first electrode layer 10 overlaps with an orthographic projection of the second green light-emitting portion 4002 on the first electrode layer 10. An orthographic projection of the first blue light-emitting portion 2003 on the first electrode layer 10 overlaps with an orthographic projection of the second blue light-emitting portion 4003 on the first electrode layer 10. The light-emitting portions of different light-emitting layers with the same light-emitting color can maximize interference while avoiding the picture difference caused by light mixing.

Figure 4:
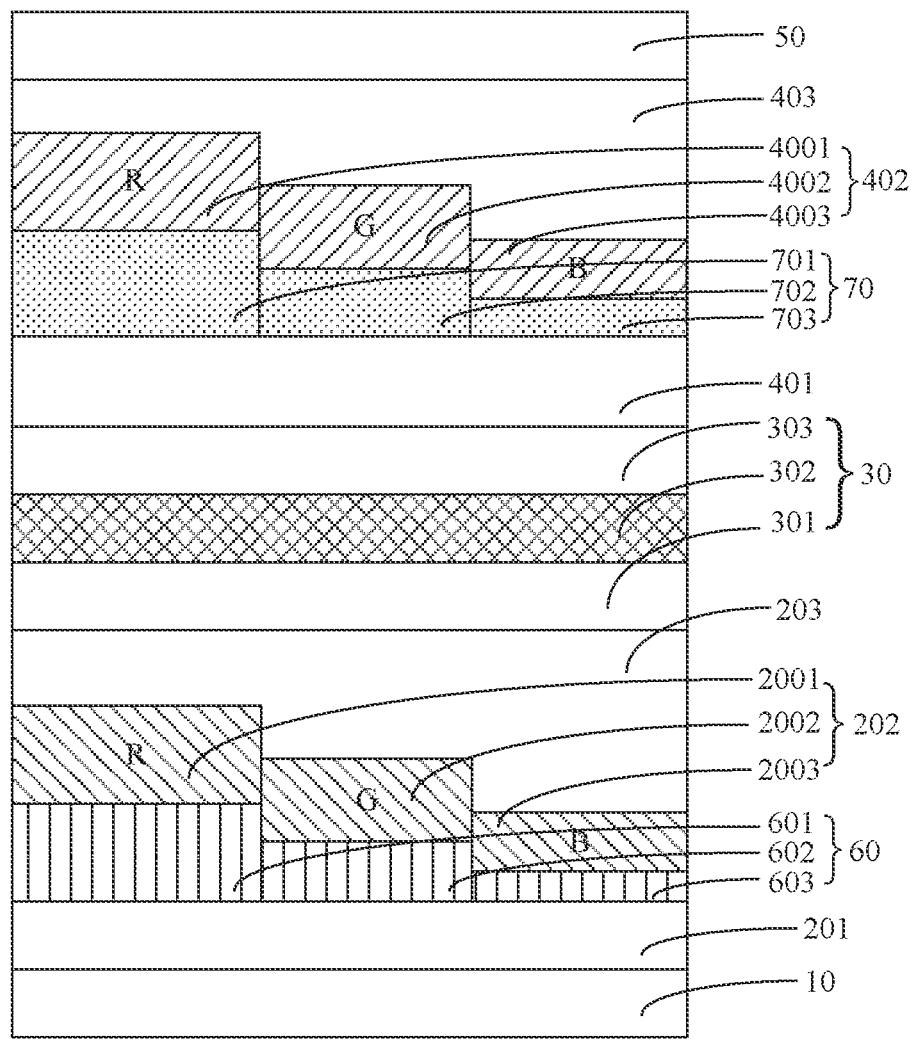
FIG. 4 is a cross-sectional view of a fourth type of the light-emitting device of the present disclosure embodiment.

Referring to FIG. 4, in an embodiment, the light-emitting device further includes a compensation layer. The compensation layer includes a first compensation layer 60 and a second compensation layer 70. The first compensation layer 60 is disposed on a surface of the first light-emitting layer 202 close to the anode. The second compensation layer 70 is disposed on a surface of the second light-emitting layer 402 close to the anode.

The first compensation layer 60 includes a first red compensation portion 601 aligned with the first red light-emitting portion 2001, a first green compensation portion 602 aligned with the first green light-emitting portion 2002, and a first blue compensation portion 603 aligned with the first blue light-emitting portion 2003.

A height of the first red compensation portion 601 is greater than a height of the first green compensation portion 602 than a height of the first blue compensation portion 603.

The second compensation layer 70 includes a second red compensation portion 701 aligned with the second red light-emitting portion 4001, a second green compensation portion 702 aligned with the second green light-emitting portion 4002, and a second blue compensation portion 703 aligned with the second blue light-emitting portion 4003.

A height of the second red compensation portion 701 is greater than a height of the second green compensation portion 702 than a height of the second blue compensation portion 703.

It should be noted that the $\lambda$ includes $\lambda_1$ corresponding to the first red light-emitting portion 2001 and the second red light-emitting portion 4001, $\lambda_2$ corresponding to the first green light-emitting portion 2002 and the second green light-emitting portion 4002, and $\lambda_3$ corresponding to the first blue light-emitting portion 2003 and the second blue light-emitting portion 4003, where $\lambda_1>\lambda_2>\lambda_3$.

In this embodiment, the first optical path length, the second optical path length, and the third optical path length of the sub-pixel units of different colors are individually adjusted by arranging the compensation part under each light-emitting portion. It is realized that the sub-pixel unit of any luminous color meets a microcavity interference condition, the light enhancement effect of the same wavelength is realized, the luminous efficiency of the device is improved, and a peak shift under large viewing angles is reduced.

The present disclosure also proposes an OLED display panel, a display module, and a display device. The OLED display panel includes the light-emitting device described in any of the above embodiments. The display module includes the light-emitting device described in any of the above embodiments. The display device also includes the above-mentioned light-emitting device, which will not be repeated here.

The light-emitting device of this embodiment includes a first electrode layer, at least two light-emitting structure layers, a second electrode layer, and a charge generation layer. The light-emitting structure layers are stacked on the first electrode layer. The light-emitting structure layer includes an electron transport layer, a light-emitting layer, and a hole transport layer. The light-emitting layer is disposed between the adjacent electron transport layer and the hole transport layer. The second electrode layer is disposed on the light-emitting structure layer. The charge generation layer is disposed between two adjacent light-emitting structure layers. The charge generation layer includes an N-type electron generation layer, a metal activation layer, and a P-type hole generation layer. The metal activation layer is disposed between the N-type electron generation layer and the P-type hole generation layer. One surface and another surface of the metal activation layer are in surface contact with the N-type electron generation layer and the P-type hole generation layer, respectively. In the present disclosure, the metal activation layer is disposed between the N-type electron generation layer and the P-type hole generation layer, and the metal activation layer is in surface contact with of both. The metal activation layer can activate a surface energy at contact surfaces to increase a transport rate of holes and electrons. An electric charge accumulation is prevented from forming an electric field in an internal space, a working voltage is reduced, and a performance and a lifespan of the light-emitting device are improved.

In the above-mentioned embodiments, the description of each embodiment has its own focus. For parts that are not described in detail in an embodiment, reference may be made to related descriptions of other embodiments.

The light-emitting device of the embodiments of the present disclosure has been described in detail above. In this specification, specific examples are used to illustrate the principle and implementation of the present disclosure. The description of the above embodiments is only used to help understand the method and core idea of the present disclosure. At the same time, for those skilled in the art, based on the idea of the present disclosure, there will be changes in the specific implementation and the scope of application. In summary, the content of this specification should not be construed as a restriction on the present disclosure.

What is claimed is:

1. A light-emitting device, comprising:
a first electrode layer;
at least two light-emitting structure layers sequentially stacked on the first electrode layer;
a second electrode layer disposed on the light-emitting structure layers; and
a charge generation layer disposed between the light-emitting structure layers;
wherein the charge generation layer comprises an N-type electron generation layer, a metal activation layer, and a P-type hole generation layer, the metal activation layer is disposed between the N-type electron generation layer and the P-type hole generation layer, and one surface and another surface of the metal activation layer are in surface contact with the N-type electron generation layer and the P-type hole generation layer, respectively;
wherein the first electrode layer is an anode, the second electrode layer is a cathode, the at least two light-emitting structure layers comprise a first light-emitting structure layer and a second light-emitting structure layer, the first light-emitting structure layer is disposed on the anode, the charge generation layer is disposed on the first light-emitting structure layer, and the second light-emitting structure layer is disposed on the charge generation layer; and the first light-emitting structure layer comprises a first hole transport layer, a first light-emitting layer, and a first electron transport layer that are stacked, the second light-emitting structure layer comprises a second hole transport layer, a second light-emitting layer, and a second electron transport layer that are stacked, the N-type electron generation layer is disposed on the first electron transport layer, the metal activation layer is disposed on the N-type electron generation layer, the P-type hole generation layer is disposed on the metal activation layer, and the second hole transport layer is disposed on the P-type hole generation layer; and
wherein a ratio of a distance from the first light-emitting layer to the anode to a distance from the first light-emitting layer to the cathode ranges from 1:3 to 1:4; a ratio of a distance from the metal activation layer to the anode to a distance from the metal activation layer to the cathode ranges from 1:1 to 1:1.5; and a ratio of a distance from the second light-emitting layer to the anode to a distance from the second light-emitting layer to the cathode ranges from 3:1 to 3:2.

2. The light-emitting device according to claim 1, wherein the anode comprises a transparent metal layer and a reflective layer, and the metal activation layer is a semi-reflective and semi-transparent film layer.

3. The light-emitting device according to claim 2, wherein the metal activation layer comprises at least one material, and the at least one material is selected from a material group comprising silver, lithium, ytterbium, magnesium, gold, barium, calcium, aluminum, indium, LiF, indium tin oxide, indium zinc oxide, and AZO.

4. The light-emitting device according to claim 2, wherein a thickness of the metal activation layer is less than a thickness of the reflective layer.

5. The light-emitting device according to claim 2, wherein a thickness of the metal activation layer ranges from 3 Å to 100 Å.

6. The light-emitting device according to claim 2, wherein there is a first optical path length between the anode and the first light-emitting layer, there is a second optical path length between the anode and the metal activation layer, there is a third optical path length between the anode and the second light-emitting layer, the first optical path length is $\delta A$, the second optical path length is $\delta B$, the third optical path length is $\delta C$, a range of the first optical path length $\delta A$ is $(1/4)m_1\lambda \pm 50$ Å, a range of the second optical path length $\delta B$ is $(2/4)m_2\lambda \pm 50$ Å, a range of the third optical path length $\delta C$ is $(3/4)m_3/\pm 50$ Å, $m_1$, $m_2$, and $m_3$ are all positive integers, and $\lambda$ is a light emission wavelength of the light-emitting layer.

7. The light-emitting device according to claim 6, wherein a thickness of each functional film layer in the third optical path length and its refractive index satisfy a following relationship: $n_1d_1+n_2d_2+ \ldots +n_id_i=(3/4) m_3\lambda+50$ Å, $d_i$ is a thickness of a functional film layer of an i-th layer, $n_i$ is a refractive index of the functional film layer of the i-th layer, $m_3$ is a positive integer, and $\lambda$ is the light emission wavelength of the light-emitting layer.

8. The light-emitting device according to claim 6, wherein a range of the first optical path length $\delta A$ is $(1/4)\lambda \pm 50$ Å, a range of the second optical path length δB is (⅔)λ±50 Å, and a range of the second optical path length δC is (¾)λ±50 Å.

9. The light-emitting device according to claim 6, wherein a distance from the first light-emitting layer to the reflective layer, a distance from the first light-emitting layer to the metal activation layer, and a distance from the metal activation layer to the second light-emitting layer are equal.

10. The light-emitting device according to claim 2, wherein the first light-emitting layer comprises a first red light-emitting portion, a first blue light-emitting portion, and a first green light-emitting portion, the second light-emitting layer comprises a second red light-emitting portion, a second blue light-emitting portion, and a second green light-emitting portion, the first red light-emitting portion and the second red light-emitting portion are aligned, the first blue light-emitting portion and the second blue light-emitting portion are aligned, and the first green light-emitting portion and the second green light-emitting portion are aligned.

11. The light-emitting device according to claim 2, wherein the first light-emitting layer and the second light-emitting layer are monochromatic light-emitting layers of a same color.

12. The light-emitting device according to claim 10, wherein the light-emitting device further comprises a compensation layer, the compensation layer comprises a first compensation layer and a second compensation layer, the first compensation layer is disposed on a surface of the first light-emitting layer close to the anode, the second compensation layer is disposed on a surface of the second light-emitting layer close to the anode, and the compensation layer is configured to adjust the first optical path length, the second optical path length, and the third optical path length.

13. The light-emitting device according to claim 12, wherein the first compensation layer comprises a first red compensation portion corresponding to the first red light-emitting portion, a first blue compensation portion corresponding to the first blue light-emitting portion, and a first green compensation portion corresponding to the first green light-emitting portion, and the first red compensation portion, the first green compensation portion, and the first blue compensation portion have different heights.

14. The light-emitting device according to claim 13, wherein a height of the first red compensation portion is greater than a height of the first green compensation portion than a height of the first blue compensation portion.

15. The light-emitting device according to claim 12, wherein the second compensation layer comprises a second red compensation portion corresponding to the second red light-emitting portion, a second blue compensation portion corresponding to the second blue light-emitting portion, and a second green compensation portion corresponding to the second green light-emitting portion, and the second red compensation portion, the second green compensation portion, and the second blue compensation portion have different heights.

16. The light-emitting device according to claim 15, wherein a height of the second red compensation portion is greater than a height of the second green compensation portion than a height of the second blue compensation portion.

17. An organic light-emitting diode (OLED) display panel, comprising a light-emitting device; the light-emitting device comprising:
a first electrode layer;
at least two light-emitting structure layers sequentially stacked on the first electrode layer;
a second electrode layer disposed on the light-emitting structure layers; and
a charge generation layer disposed between the light-emitting structure layers; and
wherein the charge generation layer comprises an N-type electron generation layer, a metal activation layer, and a P-type hole generation layer, the metal activation layer is disposed between the N-type electron generation layer and the P-type hole generation layer, and one surface and another surface of the metal activation layer are in surface contact with the N-type electron generation layer and the P-type hole generation layer, respectively;
wherein the first electrode layer is an anode, the second electrode layer is a cathode, the at least two light-emitting structure layers comprise a first light-emitting structure layer and a second light-emitting structure layer, the first light-emitting structure layer is disposed on the anode, the charge generation layer is disposed on the first light-emitting structure layer, and the second light-emitting structure layer is disposed on the charge generation layer; and the first light-emitting structure layer comprises a first hole transport layer, a first light-emitting layer, and a first electron transport layer that are stacked, the second light-emitting structure layer comprises a second hole transport layer, a second light-emitting layer, and a second electron transport layer that are stacked, the N-type electron generation layer is disposed on the first electron transport layer, the metal activation layer is disposed on the N-type electron generation layer, the P-type hole generation layer is disposed on the metal activation layer, and the second hole transport layer is disposed on the P-type hole generation layer; and
wherein a ratio of a distance from the first light-emitting layer to the anode to a distance from the first light-emitting layer to the cathode ranges from 1:3 to 1:4; a ratio of a distance from the metal activation layer to the anode to a distance from the metal activation layer to the cathode ranges from 1:1 to 1:1.5; and a ratio of a distance from the second light-emitting layer to the anode to a distance from the second light-emitting layer to the cathode ranges from 3:1 to 3:2.

18. A light-emitting device, comprising:
a first electrode layer;
at least two light-emitting structure layers sequentially stacked on the first electrode layer, wherein each of the light-emitting structure layers comprises an electron transport layer, a light-emitting layer, and a hole transport layer, and the light-emitting layer is disposed between the adjacent electron transport layer and the hole transport layer;
a second electrode layer disposed on the light-emitting structure layers; and
a charge generation layer disposed between the light-emitting structure layers;
wherein the charge generation layer comprises an N-type electron generation layer, a metal activation layer, and a P-type hole generation layer, the metal activation layer is disposed between the N-type electron generation layer and the P-type hole generation layer, and one surface and another surface of the metal activation layer are in surface contact with the N-type electron generation layer and the P-type hole generation layer, respectively;
wherein the first electrode layer is an anode, the second electrode layer is a cathode, and wherein a ratio of a distance from the metal activation layer to the anode to a distance from the metal activation layer to the cathode ranges from 1:1 to 1:1.5.

* * * * *